United States Patent
Ogami et al.

(10) Patent No.: US 9,787,277 B2
(45) Date of Patent: Oct. 10, 2017

(54) VARIABLE FILTER CIRCUIT AND WIRELESS COMMUNICATION APPARATUS

(71) Applicant: Murata Manufacturing Co., Ltd., Kyoto (JP)

(72) Inventors: Takashi Ogami, Kyoto (JP); Hitoshi Tada, Kyoto (JP); Masakazu Tani, Kyoto (JP); Shouzo Sugiyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/230,764

(22) Filed: Aug. 8, 2016

(65) Prior Publication Data

US 2016/0344364 A1    Nov. 24, 2016

(30) Foreign Application Priority Data

Feb. 10, 2014 (JP) .................................. 2014-023342
Sep. 30, 2014 (JP) .................................. 2014-202072

(51) Int. Cl.
| | |
|---|---|
| *H04B 1/10* | (2006.01) |
| *H03H 7/01* | (2006.01) |
| *H01G 7/06* | (2006.01) |
| *H03H 7/075* | (2006.01) |
| *H03H 9/54* | (2006.01) |
| *H01G 17/00* | (2006.01) |
| *H04B 1/00* | (2006.01) |

(Continued)

(52) U.S. Cl.
CPC ............. *H03H 7/0115* (2013.01); *H01G 7/06* (2013.01); *H01G 17/00* (2013.01); *H03H 7/0153* (2013.01); *H03H 7/075* (2013.01); *H03H 9/542* (2013.01); *H03H 9/605* (2013.01); *H03H 9/6483* (2013.01); *H04B 1/0064* (2013.01); *H04B 1/126* (2013.01); *H03H 2210/025* (2013.01)

(58) Field of Classification Search
CPC .... H03H 9/6403; H03H 7/0115; H03H 7/075; H03H 9/542
USPC ............... 455/176.1, 213, 307; 333/202, 219
See application file for complete search history.

(56) References Cited

U.S. PATENT DOCUMENTS

| | | |
|---|---|---|
| 6,472,953 B1 | 10/2002 | Sakuragawa et al. |
| 2001/0048352 A1 | 12/2001 | Klee et al. |
| | (Continued) | |

FOREIGN PATENT DOCUMENTS

| | | |
|---|---|---|
| JP | H10-65490 A | 3/1998 |
| JP | 2000-323961 A | 11/2000 |
| | (Continued) | |

OTHER PUBLICATIONS

Written Opinion of PCT/JP2015/053170 dated Apr. 28, 2015.
(Continued)

*Primary Examiner* — Sonny Trinh
(74) *Attorney, Agent, or Firm* — Pearne & Gordon LLP

(57) ABSTRACT

A variable filter circuit includes a serial arm connected between ports (P1-P2), a parallel arm having a resonator connected in series between ports (P1-P3), and another parallel arm having another resonator connected in series between ports (P2-P3). The serial arm includes a capacitor connected between the ports (P1-P2), and the parallel arms include variable capacitances connected in series to the resonators.

16 Claims, 12 Drawing Sheets

(51) Int. Cl.
  *H04B 1/12*  (2006.01)
  *H03H 9/60*  (2006.01)
  *H03H 9/64*  (2006.01)

(56) References Cited

U.S. PATENT DOCUMENTS

| | | |
|---|---|---|
| 2004/0058664 A1 | 3/2004 | Yamamoto |
| 2004/0119561 A1 | 6/2004 | Omote |
| 2005/0099244 A1 | 5/2005 | Nakamura et al. |
| 2005/0212612 A1 | 9/2005 | Kawakubo et al. |
| 2009/0201104 A1 | 8/2009 | Ueda |
| 2011/0199169 A1 | 8/2011 | Kadota |
| 2012/0313731 A1 | 12/2012 | Burgener |
| 2014/0106698 A1* | 4/2014 | Mi ................. H03H 7/0123 455/307 |
| 2016/0344364 A1* | 11/2016 | Ogami ................. H01G 7/06 |
| 2016/0344370 A1* | 11/2016 | Tani ................. H03H 7/0161 |
| 2016/0352310 A1* | 12/2016 | Tani ................. H03H 9/64 |

FOREIGN PATENT DOCUMENTS

| | | |
|---|---|---|
| JP | 2002-290204 A | 10/2002 |
| JP | 2003-530705 A | 10/2003 |
| JP | 2004-129238 A | 4/2004 |
| JP | 2004-135322 A | 4/2004 |
| JP | 2004-173245 A | 6/2004 |
| JP | 4053504 A | 2/2008 |
| JP | 2009-207116 A | 9/2009 |
| JP | 2014-502803 A | 2/2014 |
| WO | 2010/058544 A1 | 5/2010 |
| WO | 2012/114930 A1 | 8/2012 |

OTHER PUBLICATIONS

International search report of PCT/JP2015/053170 dated Apr. 28, 2015.

Office action issued in JP2015-561019 dated Aug. 8, 2017.

* cited by examiner

| COMMUNICATION BAND | FIRST BAND | SECOND BAND | THIRD BAND | FOURTH BAND |
|---|---|---|---|---|
| SELECTING PORTION SW1 | Psw1 | Psw1 | Psw3 | Psw3 |
| SELECTING PORTION SW2 | Psw2 | Psw2 | Psw4 | Psw4 |

VARIABLE FILTER CIRCUIT AND WIRELESS COMMUNICATION APPARATUS

This application is a continuation of International Application No. PCT/JP2015/053170 filed on Feb. 5, 2015 which claims priority from Japanese Patent Application No. JP2014-202072 filed on Sep. 30, 2014 and Japanese Patent Application No. JP2014-023342 filed on Feb. 10, 2014. The contents of these applications are incorporated herein by reference in their entireties.

BACKGROUND

Technical Field

The present disclosure relates to a variable filter circuit and a wireless communication apparatus including the variable filter circuit.

Background Art

Conventional variable filter circuits have been given ladder configurations, in which basic circuits are configured by connecting variable capacitances in parallel or in series to resonators such as SAW resonators or BAW resonators and such basic circuits are then combined in multiple stages (see Patent Document 1, for example). In a variable filter circuit, an anti-resonant frequency of each basic circuit is adjusted by controlling the variable capacitance connected in parallel to the resonator, and a resonant frequency of each basic circuit is adjusted by controlling both the variable capacitance connected in parallel and the variable capacitance connected in series to each resonator. A desired band can be set as a pass band as a result.

Patent Document 1: Japanese Patent No. 4053504

BRIEF SUMMARY

In a conventional variable filter circuit, although a pass band can be adjusted by controlling a variable capacitance, it has been difficult to obtain desired attenuation characteristics. Specifically, it has been difficult to obtain steep attenuation characteristics near a low-frequency side of the pass band. Additionally, because the frequency of the pass band is varied by connecting two variable capacitances to a single resonator, it is necessary to provide 2×n variable capacitances in the case where n resonators are provided, which tends to increase the total number of variable capacitances. This has led to an increase in the circuit size and complication of the control system.

Accordingly, the present disclosure provides a variable filter circuit and a wireless communication apparatus in which it is easy to obtain steep attenuation characteristics near a low-frequency side of a pass band and in which the circuit size is not easily increased and the control system is not easily complicated even when multiple stages are configured.

A variable filter circuit according to this disclosure includes a serial arm connected between a first input/output end and a second input/output end, a first parallel arm including a resonator connected in series between the first input/output end and a ground connection end, and a second parallel arm including a resonator connected in series between the second input/output end and the ground connection end.

The serial arm includes a capacitor connected in series between the first input/output end and the second input/output end. In this case, steep attenuation characteristics near a low-frequency side of a pass band can be obtained by appropriately adjusting the capacitance of the capacitor.

Additionally, each of the first and second parallel arms includes a variable reactance connected in series to the resonator. In this case, a cutoff frequency on a low-frequency side of a pass band can be adjusted by controlling the variable reactance, while keeping the steepness of the attenuation characteristics high near the low-frequency side of the pass band.

In order to increase the steepness of the attenuation characteristics of the filter in such a variable filter circuit, one each of a serial arm and a parallel arm may be added, with one end of the added serial arm being connected to the first input/output end or the second input/output end, and another end of the serial arm being connected to the added parallel arm. Accordingly, even in the case where the variable filter circuit is configured having n stages of serial arms, the number of parallel arms and variable reactances need only to be n+1, which makes it possible to suppress an increase in the circuit size and complication of the control system more than has been possible with conventional configurations.

The variable filter circuit according to this disclosure can further include a serial inductor connected in series to each of the resonators. Connecting a serial inductor to the resonator in this manner adjusts a resonance point of the resonator further to the low-frequency side and widens a frequency interval between the resonance point and an anti-resonance point.

Additionally, the variable filter circuit according to this disclosure can further include a parallel inductor connected in parallel to each of the resonators. Connecting a parallel inductor to the resonator in this manner adjusts the anti-resonance point of the resonator further to the high-frequency side and widens a frequency interval between the resonance point and the anti-resonance point.

When the frequency interval between the resonance point and the anti-resonance point of the resonator is widened in this manner, a range of variation of the cutoff frequency on the low-frequency side of the pass band, which can be adjusted by controlling the variable reactance, is widened as well.

The variable filter circuit according to this disclosure may be configured to include a parallel inductor connected in parallel to the resonator and a serial inductor connected in series to a circuit in which the resonator and the parallel inductor are connected in parallel. Additionally, the variable filter circuit may be configured to include a serial inductor connected in series to the resonator and a parallel inductor connected in parallel to a circuit in which the resonator and the serial inductor are connected in series. Changing the connection configurations of the serial inductor and the parallel inductor in this manner makes it possible to make adjustments such as adjusting the range of variation of the cutoff frequency on the low-frequency side of the pass band, making the attenuation characteristics steeper near the low-frequency side of the pass band, and so on.

The variable filter circuit according to this disclosure may be configured so that each of the first parallel arm and the second parallel arm further includes a parallel inductor connected in parallel to the resonator, the first parallel arm includes a serial inductor connected in series to the resonator, and the second parallel arm does not include a serial inductor connected in series to the resonator. Employing such a configuration makes it possible to reduce the circuit size by an amount corresponding to omitting the serial inductor from the second parallel arm, as compared to a case where both the first parallel arm and the second parallel arm are provided with a serial inductor and a parallel inductor. In such a case, a resonance point and an anti-resonance point of the resonator included in the first parallel arm can be further on a high-frequency side than a resonance point and an anti-resonance point of the resonator included in the second parallel arm. Additionally, an inductance of the parallel inductor included in the second parallel arm can be lower than an inductance of the parallel inductor included in the first parallel arm. Doing so makes it possible to suppress a significant degradation in the filter characteristics of the variable filter circuit, a significant narrowing of the range of variation of the cutoff frequency, and so on, even if the serial inductor is omitted from the second parallel arm.

The variable filter circuit according to this disclosure may include a plurality of the resonators and a selecting portion that selects one of the plurality of resonators and connects the selected resonator in series to the variable reactance. Additionally, the filter circuit may be configured including a plurality of serial inductors, a plurality of parallel inductors, or the like, with one of the inductors being selected along with a resonator by the selecting portion and connected in series to the variable reactance. In such a case, having the respective resonators handle different communication bands makes it possible for the variable filter circuit to handle many communication bands, and makes it possible to select a communication band through control of the selecting portion. Although it is normally necessary to provide substantially the same number of parallel arms as there are communication bands in order for the variable filter circuit to be capable of handling many communication bands, providing the selecting portion as described above and selecting the resonator to connect to the variable reactance eliminates the need to provide a parallel arm for each communication band, and makes it possible to share a variable reactance among several communication bands. Accordingly, the total number of variable reactances can be suppressed, and an increase in the circuit size, complication of the variable reactance control, and the like can be suppressed.

A wireless communication apparatus according to this disclosure can include a front end circuit including the above-described variable filter circuit, an antenna, and a communication circuit connected to the antenna through the front end circuit. In particular, in the wireless communication apparatus, it is desirable that the communication circuit handle a plurality of communication bands, and that an anti-resonance point in the case where at least one of the parallel arms does not include the variable reactance be higher than an upper limit frequency on a high-frequency side of a stop band of the communication band, among the plurality of communication bands, that is furthest on the high-frequency side. Additionally, it is desirable that a resonance point in the case where at least one of the parallel arms does not include the variable reactance be lower than a lower limit frequency on a low-frequency side of a stop band of the communication band, among the plurality of communication bands, that is furthest on the low-frequency side.

It is necessary to provide a stop band and a pass band in each of the plurality of communication bands handled by the communication circuit. Setting the relationships between the resonance points and anti-resonance points of each parallel arm in the plurality of communication bands as described above makes it possible to adjust the cutoff frequency on the low-frequency side in the pass band of the variable filter circuit to the low-frequency side of the pass bands of each of the plurality of communication bands handled by the communication circuit. Additionally, in the case where the stop band of the communication band is located near the low-frequency side of the pass band, the variable filter circuit can achieve a large attenuation with respect to that stop band.

Alternatively, in the wireless communication apparatus, it is desirable that the variable filter circuit include a serial inductor connected in series to each of the resonators in the parallel arm, the communication circuit handle a plurality of communication bands, and a sub-resonance point in the case where at least one of the parallel arms does not include the variable reactance be lower than a lower limit frequency on a low-frequency side of a stop band of the communication band, among the plurality of communication bands, that is furthest on the low-frequency side.

When a serial inductor is connected to the resonator, a resonance point also appears further on the high-frequency side than the anti-resonance point of the resonator (called a sub-resonance point). In this case, in the bandpass characteristics, a second pass band arises on the high-frequency side in addition to the first pass band on the low-frequency side. The cutoff frequency on the low-frequency side can be adjusted for the second pass band on the high-frequency side as well by controlling the capacitance of the variable reactance. Setting the relationship between the plurality of communication bands and the sub-resonance points in each parallel arm as described above makes it possible to adjust the second pass band on the high-frequency side of the variable filter circuit to the pass bands of the plurality of communication bands handled by the communication circuit.

According to the present disclosure, steep attenuation characteristics can be achieved near a low-frequency side of a pass band, and a cutoff frequency on the low-frequency side of the pass band can be adjusted by controlling a variable reactance. As such, even in the case where a variable filter circuit is configured having n stages of serial arms, the number of variable reactances need only to be n+1, which makes it possible to suppress an increase in the circuit size and complication of the control system more than has been possible with conventional configurations.

DETAILED DESCRIPTION

Figure 1:
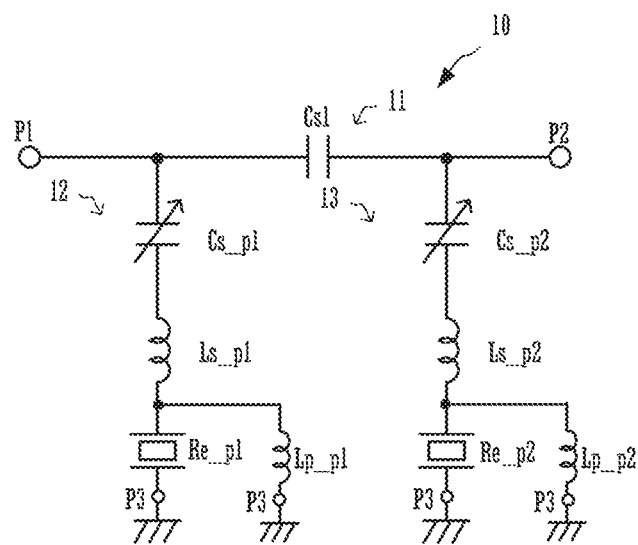
FIG. 1 is a circuit diagram of a variable filter circuit according to a first embodiment.

Several embodiments for carrying out the present disclosure will be described hereinafter with reference to the drawings, using several specific examples. Corresponding elements in the drawings are given the same reference numerals. It goes without saying that the embodiments are merely examples, and that configurations described in different embodiments can replace each other or be combined as well.

First Embodiment

FIG. 1 is a circuit diagram illustrating a variable filter circuit 10 according to a first embodiment of the present disclosure.

The variable filter circuit 10 includes ports P1, P2, and P3, a serial arm 11, and parallel arms 12 and 13. The port P1 is a first input/output end of the variable filter circuit 10. The port P2 is a second input/output end of the variable filter circuit 10. The port P3 is a ground connection end of the variable filter circuit 10. The serial arm 11 is connected in series between the port P1 and the port P2. The parallel arm 12 is connected in series between the port P1 and the port P3. The parallel arm 13 is connected in series between the port P2 and the port P3.

The serial arm 11 includes a capacitor Cs1. The capacitor Cs1 is provided between the port P1 and the port P2, with one end thereof connected to one end of the parallel arm 12 and another end thereof connected to one end of the parallel arm 13.

The parallel arm 12 includes a resonator Re_p1, a variable capacitance Cs_p1, a serial inductor Ls_p1, and a parallel inductor Lp_p1. One end of the variable capacitance Cs_p1 is connected to the port P1. One end of the resonator Re_p1 is connected to the port P3. The serial inductor Ls_p1 is connected in series between another end of the resonator Re_p1 and another end of the variable capacitance Cs_p1. The parallel inductor Lp_p1 is connected in parallel to the resonator Re_p1, with one end thereof connected to a connection point between the other end of the resonator Re_p1 and the serial inductor Ls_p1, and another end thereof connected to the port P3.

The parallel arm 13 includes a resonator Re_p2, a variable capacitance Cs_p2, a serial inductor Ls_p2, and a parallel inductor Lp_p2. One end of the variable capacitance Cs_p2 is connected to the port P2. One end of the resonator Re_p2 is connected to the port P3. The serial inductor Ls_p2 is connected in series between another end of the resonator Re_p2 and another end of the variable capacitance Cs_p2. The parallel inductor Lp_p2 is connected in parallel to the resonator Re_p2, with one end thereof connected to a connection point between the other end of the resonator Re_p2 and the serial inductor Ls_p2, and another end thereof connected to the port P3.

The element values, characteristics, and so on of the capacitor Cs1, the resonators Re_p1 and Re_p2, the variable capacitances Cs_p1 and Cs_p2, the serial inductors Ls_p1 and Ls_p2, and the parallel inductors Lp_p1 and Lp_p2 can be set as appropriate.

Figure 2:
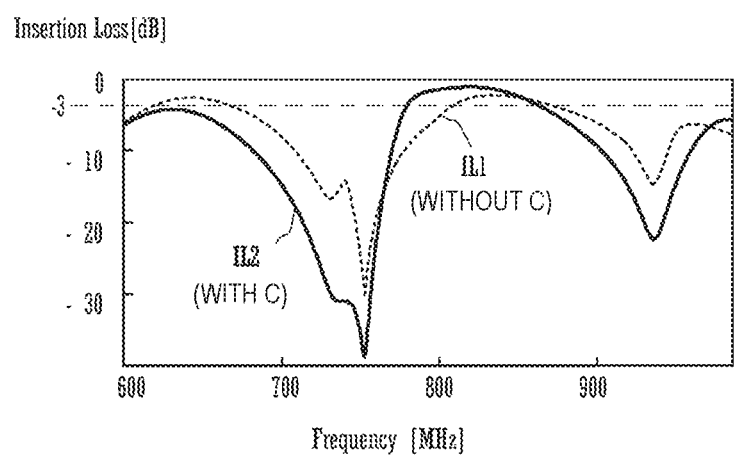
FIG. 2 is a characteristic graph illustrating a function of a capacitor that constitutes the variable filter circuit according to the first embodiment.

FIG. 2 is a bandpass characteristic graph illustrating a function of the capacitor Cs1. The dotted line in FIG. 2 represents bandpass characteristics IL1 in a configuration in which the capacitor Cs1 is omitted from the variable filter circuit 10. The solid line in FIG. 2, meanwhile, represents bandpass characteristics IL2 of the variable filter circuit 10 provided with the capacitor Cs1. Note that the bandpass characteristics IL1 and IL2 both assume that the variable capacitances Cs_p1 and Cs_p2 are set to the same capacitance values, namely approximately 4.3 pF.

Both the bandpass characteristics IL1 in the configuration without the capacitor Cs1 and the bandpass characteristics IL2 in the configuration with the capacitor Cs1 have an attenuation pole at approximately 750 MHz. The bandpass characteristics IL1 have a pass band where the attenuation is lower than −3 dB from approximately 810 MHz to 860 MHz. On the other hand, the bandpass characteristics IL2 have a pass band where the attenuation is lower than −3 dB from approximately 780 MHz to 860 MHz. Attenuation characteristics near a low-frequency side of these pass bands are comparatively soft in the bandpass characteristics IL1 and comparatively steep in the bandpass characteristics IL2. Accordingly, the variable filter circuit 10 can improve the steepness near the low-frequency side of the pass band by using the capacitor Cs1.

Figure 3A:
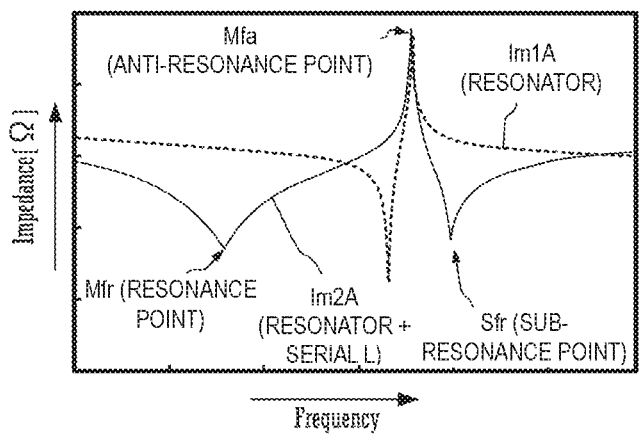
FIGS. 3A-3C illustrate characteristic graphs indicating functions of a serial inductor and a parallel inductor that constitute the variable filter circuit according to the first embodiment.

FIG. 3A is an impedance characteristic graph illustrating the function of the serial inductor Ls_p1 in the parallel arm 12. The dotted line in FIG. 3A indicates impedance characteristics Im1A of the resonator Re_p1. The solid line in FIG. 3A, meanwhile, indicates impedance characteristics Im2A of the resonator Re_p1 when the serial inductor Ls_p1 is connected.

In the impedance characteristics Im2A for the case where the serial inductor Ls_p1 is provided for the resonator Re_p1, a frequency of an anti-resonance point Mfa is almost unchanged from the impedance characteristics Im1A, but a frequency of a resonance point Mfr has moved to the low-frequency side compared to the impedance characteristics Im1A.

In this manner, the serial inductor Ls_p1 in the parallel arm 12 has a function of moving the resonance point Mfr to the low-frequency side. Note that the serial inductor Ls_p2 in the parallel arm 13 has the same function.

Figure 3B:
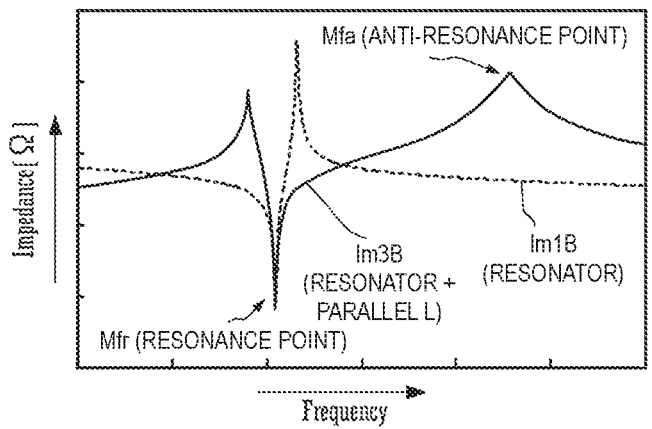

FIG. 3B is an impedance characteristic graph illustrating the function of the parallel inductor Lp_p1 in the parallel arm 12. The dotted line in FIG. 3B indicates impedance characteristics Im1B of the resonator Re_p1. The solid line in FIG. 3B, meanwhile, indicates impedance characteristics Im3B of the resonator Re_p1 when the parallel inductor Lp_p1 is connected.

In the impedance characteristics Im3B for the case where the parallel inductor Lp_p1 is provided for the resonator Re_p1, the frequency of the resonance point Mfr is almost unchanged from the impedance characteristics Im1B, but the frequency of the anti-resonance point Mfa has moved to the high-frequency side compared to the impedance characteristics Im1B.

In this manner, the parallel inductor Lp_p1 in the parallel arm 12 has a function of moving the anti-resonance point Mfa to the high-frequency side. Note that the parallel inductor Lp_p2 in the parallel arm 13 has the same function.

Figure 3C:
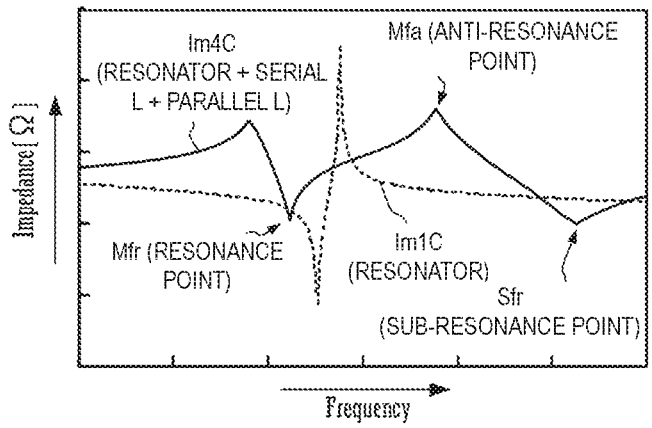

FIG. 3C is an impedance characteristic graph illustrating the functions of the serial inductor Ls_p1 and the parallel inductor Lp_p1 in the parallel arm 12. The dotted line in FIG. 3C indicates impedance characteristics Im1C of the resonator Re_p1. The solid line in FIG. 3C, meanwhile, indicates impedance characteristics Im4C of the resonator Re_p1 when the serial inductor Ls_p1 and the parallel inductor Lp_p1 are connected.

In the impedance characteristics Im4C for the case where the serial inductor Ls_p1 and the parallel inductor Lp_p1 are provided for the resonator Re_p1, the frequency of the resonance point Mfr has moved to the low-frequency side as compared to the impedance characteristics Im1C, and the frequency of the anti-resonance point Mfa has moved to the high-frequency side as compared to the impedance characteristics Im1C.

In this manner, a band between the resonance point Mfr and the anti-resonance point Mfa of the resonator Re_p1 can be widened by providing the serial inductor Ls_p1, the parallel inductor Lp_p1, and so on in the parallel arm 12. Likewise, a band between the resonance point Mfr and the anti-resonance point Mfa of the resonator Re_p2 can be widened by providing the serial inductor Ls_p2, the parallel inductor Lp_p2, and so on in the parallel arm 13.

Figure 4A:
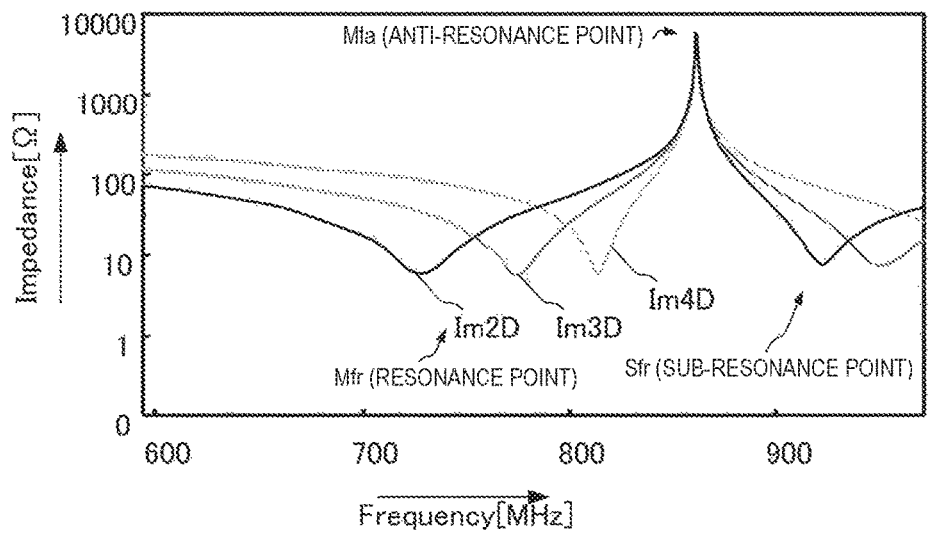
FIGS. 4A and 4B illustrate characteristic graphs indicating a function of a variable capacitance that constitutes the variable filter circuit according to the first embodiment.

FIG. 4A is an impedance characteristic graph illustrating the function of the variable capacitance Cs_p1 in the parallel arm 12. The solid lines in FIG. 4A indicate impedance characteristics Im2D, Im3D, and Im4D of the resonator Re_p1 when the serial inductor Ls_p1 and the variable capacitance Cs_p1 are connected in series. The impedance characteristics Im2D, Im3D, and Im4D are set so that the capacitance of the variable capacitance Cs_p1 becomes progressively smaller in the indicated order within a range of 1.0 pF to 10.0 pF.

In the impedance characteristics Im2D, Im3D, and Im4D, the frequency of the resonance point Mfr approaches the anti-resonance point Mfa and is located further on the high-frequency side as the capacitance of the variable capacitance Cs_p1 drops.

In this manner, the variable capacitance Cs_p1 in the parallel arm 12 has a function of moving the resonance point Mfr of the resonator Re_p1 to the high-frequency side in accordance with the capacitance. Note that the variable capacitance Cs_p2 in the parallel arm 13 also has a function of moving the resonance point Mfr of the resonator Re_p2 to the high-frequency side in accordance with the capacitance.

Figure 4B:
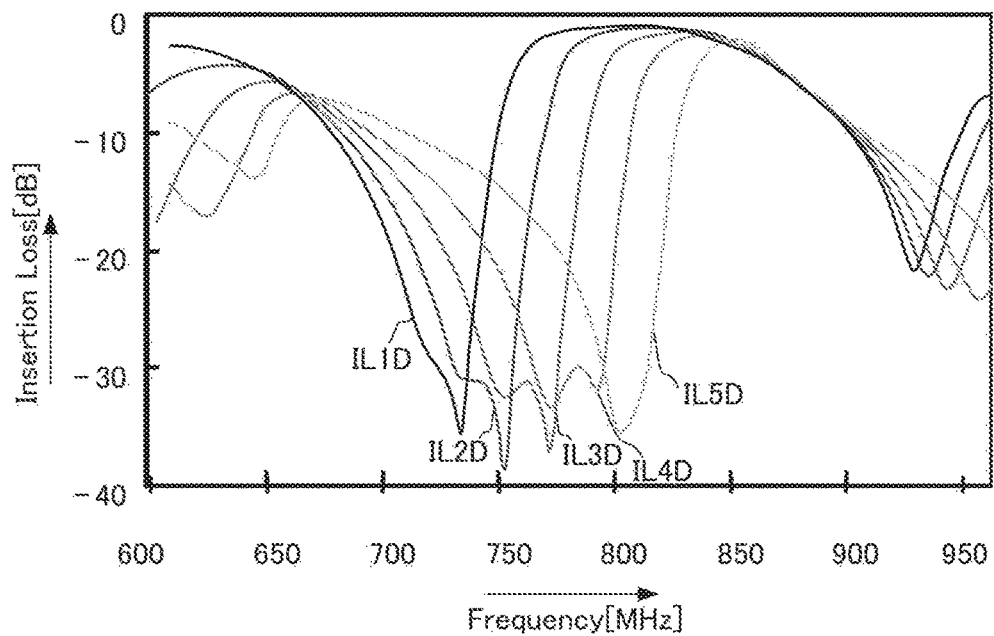

FIG. 4B is a bandpass characteristic graph illustrating the function of the variable capacitance Cs_p1 in the parallel arm 12. Bandpass characteristics IL1D, IL2D, IL3D, IL4D, and IL5D of the variable filter circuit 10, represented by the solid lines in FIG. 4B, are set so that the capacitance of the variable capacitance Cs_p1 becomes progressively smaller in the indicated order within a range of 1.0 pF to 10.0 pF.

In the bandpass characteristics IL1D, IL2D, IL3D, IL4D, and IL5D, a cutoff frequency on the low-frequency side of the pass band moves to the high-frequency side as the capacitance of the variable capacitance Cs_p1 drops. Accordingly, the variable filter circuit 10 can adjust the cutoff frequency on the low-frequency side of the pass band through control of the variable capacitance Cs_p1.

However, the cutoff frequency on the low-frequency side of the pass band cannot be adjusted to the high-frequency side beyond a predetermined frequency even if the capacitance of the variable capacitance Cs_p1 has been controlled to an extremely low value. This is because the frequency of the resonance point Mfr cannot be adjusted to the high-frequency side beyond the frequency of the anti-resonance point Mfa, and a range of variation of the cutoff frequency on the low-frequency side of the pass band is limited to a band between the resonance point Mfr and the anti-resonance point Mfa arising in a case where there is no variable capacitance. However, when the serial inductor Ls_p1, the parallel inductor Lp_p1, and so on are provided as described above, the band between the resonance point Mfr and the anti-resonance point Mfa can be widened as compared to a case where the serial inductor Ls_p1, the parallel inductor Lp_p1, and so on are not provided. Accordingly, in the variable filter circuit 10, the range of variation of the cutoff frequency on the low-frequency side of the pass band can be widened.

Although the functions of the variable capacitance Cs_p1, the serial inductor Ls_p1, and the parallel inductor Lp_p1 in the parallel arm 12 have been described here, the same applies to the functions of the variable capacitance Cs_p2, the serial inductor Ls_p2, and the parallel inductor Lp_p2 in the parallel arm 13.

As described thus far, according to the variable filter circuit 10, the cutoff frequency on the low-frequency side of the pass band can be adjusted by controlling the variable capacitances Cs_p1 and Cs_p2, in a state where steepness near the low-frequency side of the pass band is increased by providing the capacitor Cs1 and a state where the range of variation of the cutoff frequency on the low-frequency side of the pass band is widened by providing the serial inductors Ls_p1 and Ls_p2, the parallel inductors Lp_p1 and Lp_p2, and so on.

In such a variable filter circuit 10, the number of stages of serial arms, parallel arms, and the like that constitute the filter may be increased in order to further increase the steepness of the attenuation characteristics of the filter. For example, one each of a serial arm 14 and a parallel arm 15 may be newly added, with one end of the added serial arm 14 being connected to the port P1 or the port P2 and another end of the added serial arm 14 being connected to the parallel arm 15. At this time, a variable capacitance Cs_p3 of the added parallel arm 15 may be replaced with a fixed capacitance whose capacitance value does not change. Accordingly, even in the case where the variable filter circuit 10 is configured having n stages of serial arms, the total number of parallel arms and variable capacitances is a maximum of n+1, which makes it possible to suppress an increase in the circuit size and complication of the control system more than has been possible with conventional configurations. The variable filter circuit 10 according to the present embodiment may also have n+1 parallel arms and n serial arms provided.

In the variable filter circuit 10, a second pass band further on the high-frequency side can be obtained in addition to a first pass band near the resonance point Mfr, the anti-resonance point Mfa, and so on. The variable filter circuit 10 can also use the second pass band on the high-frequency side.

For example, with the impedance characteristics Im2A illustrated in FIG. 3A and the impedance characteristics Im4C illustrated in FIG. 3C, a sub-resonance point Sfr appears on the high-frequency side of the anti-resonance point Mfa. Moreover, in the impedance characteristics Im2D, Im3D, and Im4D illustrated in FIG. 4A, the frequency of the sub-resonance point Sfr changes in response to controlling the capacitances of the variable capacitances Cs_p1 and Cs_p2, like the resonance point Mfr. Accordingly, in the bandpass characteristics of the variable filter circuit 10 illustrated in FIG. 4B, an attenuation pole corresponding to the sub-resonance point Sfr can be formed further on the high-frequency side than the pass band corresponding to the anti-resonance point Mfa, and the second pass band can be obtained even further on the high-frequency side than this attenuation pole on the high-frequency side. The cutoff frequency on the low-frequency side of the second pass band that is on the high-frequency side can also be adjusted by controlling the capacitances of the variable capacitances Cs_p1 and Cs_p2.

In this manner, according to the variable filter circuit 10, the first pass band is present on the low-frequency side and the second pass band is present on the high-frequency side, and thus the range of the pass bands that can be handled can be widened by using these two pass bands together.

<<First Variation>>

Figure 5A:
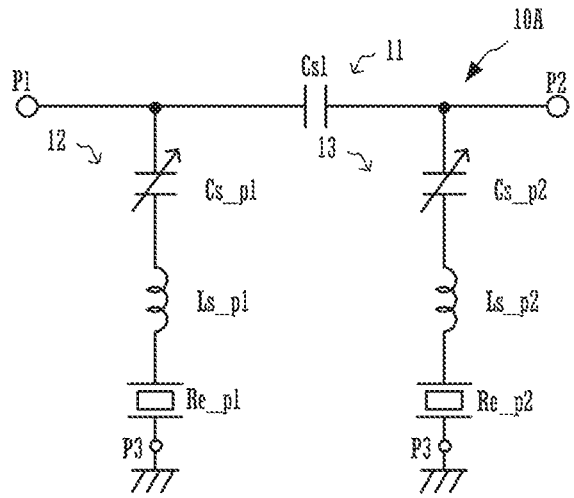
FIGS. 5A-5C include circuit diagrams illustrating variations on the variable filter circuit according to the first embodiment.

FIG. 5A is a circuit diagram illustrating a variable filter circuit 10A according to a variation on the first embodiment. The variable filter circuit 10A has almost the same configuration as in the above-described first embodiment, but has a configuration in which the parallel inductors Lp_p1 and Lp_p2 are omitted.

Figure 6A:
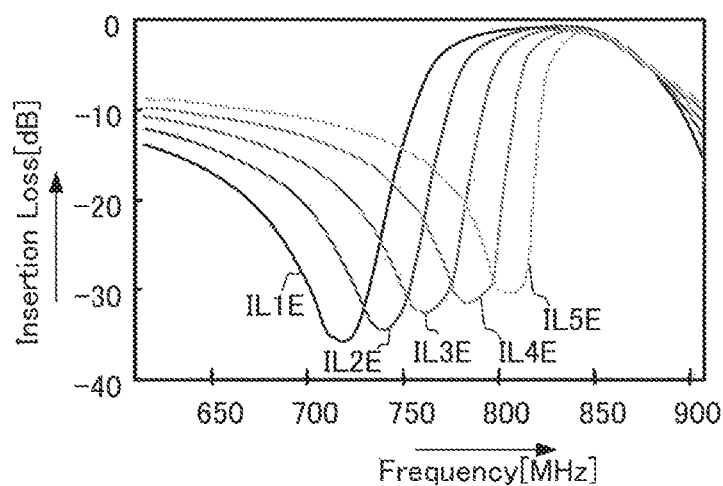
FIGS. 6A-6C illustrate characteristic graphs indicating variations on the variable filter circuit according to the first embodiment.

FIG. 6A is a bandpass characteristic graph illustrating bandpass characteristics IL1E, IL2E, IL3E, IL4E, and IL5E of the variable filter circuit 10A. The bandpass characteristics IL1E, IL2E, IL3E, IL4E, and IL5E are set so that the capacitances of the variable capacitances Cs_p1 and Cs_p2 become progressively smaller in the indicated order within a range of 1.0 pF to 10.0 pF. In the bandpass characteristics IL1E, IL2E, IL3E, IL4E, and IL5E, a cutoff frequency on the low-frequency side of the pass band appears on the high-frequency side as the capacitances of the variable capacitances Cs_p1 and Cs_p2 drop. Accordingly, the variable filter circuit 10A can also adjust the cutoff frequency on the low-frequency side of the pass band through control of the variable capacitances Cs_p1 and Cs_p2. Note that in the variable filter circuit 10A, there is a tendency for the steepness near the low-frequency side of the pass band to improve as the cutoff frequency on the low-frequency side of the pass band is adjusted to the high-frequency side.

Figure 5B:
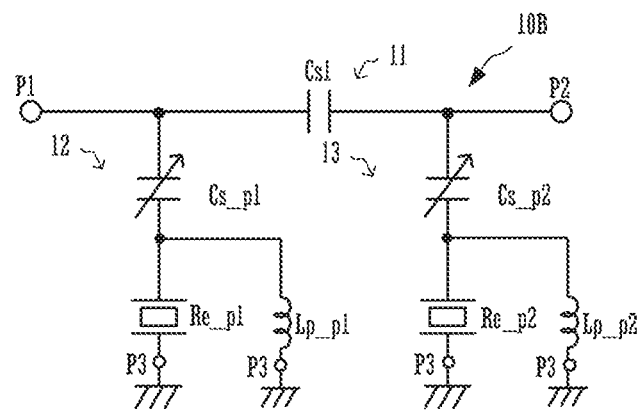

FIG. 5B is a circuit diagram illustrating a variable filter circuit 10B according to a variation on the first embodiment. The variable filter circuit 10B has almost the same configuration as in the above-described first embodiment, but has a configuration in which the serial inductors Ls_p1 and Ls_p2 are omitted.

Figure 6B:
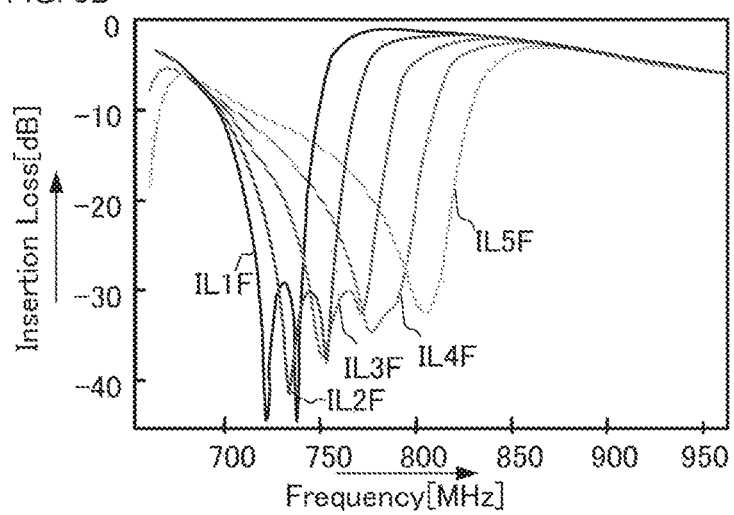

FIG. 6B is a bandpass characteristic graph illustrating bandpass characteristics IL1F, IL2F, IL3F, IL4F, and IL5F of the variable filter circuit 10B. The bandpass characteristics IL1F, IL2F, IL3F, IL4F, and IL5F are set so that the capacitances of the variable capacitances Cs_p1 and Cs_p2 become progressively smaller in the indicated order within a range of 1.0 pF to 10.0 pF. In the bandpass characteristics IL1F, IL2F, IL3F, IL4F, and IL5F, a cutoff frequency on the low-frequency side of the pass band appears on the high-frequency side as the capacitances of the variable capacitances Cs_p1 and Cs_p2 drop. Accordingly, the variable filter circuit 10B can also adjust the cutoff frequency on the low-frequency side of the pass band through control of the variable capacitances Cs_p1 and Cs_p2.

Figure 5C:
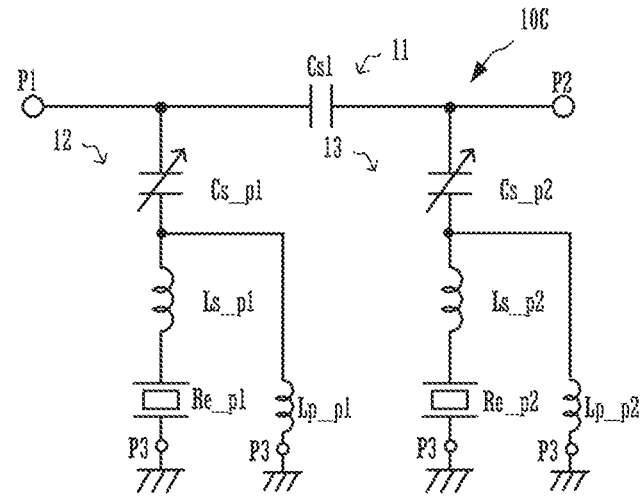

FIG. 5C is a circuit diagram illustrating a variable filter circuit 10C according to a variation on the first embodiment. The variable filter circuit 10C has almost the same configuration as in the above-described first embodiment, but one end of each of the parallel inductors Lp_p1 and Lp_p2 is connected to a corresponding connection point between the variable capacitances Cs_p1 and Cs_p2 and the serial inductors Ls_p1 and Ls_p2, and the other end is connected to the port P3. In other words, in the variable filter circuit 10C, the parallel inductors Lp_p1 and Lp_p2 are connected in parallel to serial circuits that include the resonators Re_p1 and Re_p2 and the serial inductors Ls_p1 and Ls_p2.

Figure 6C:
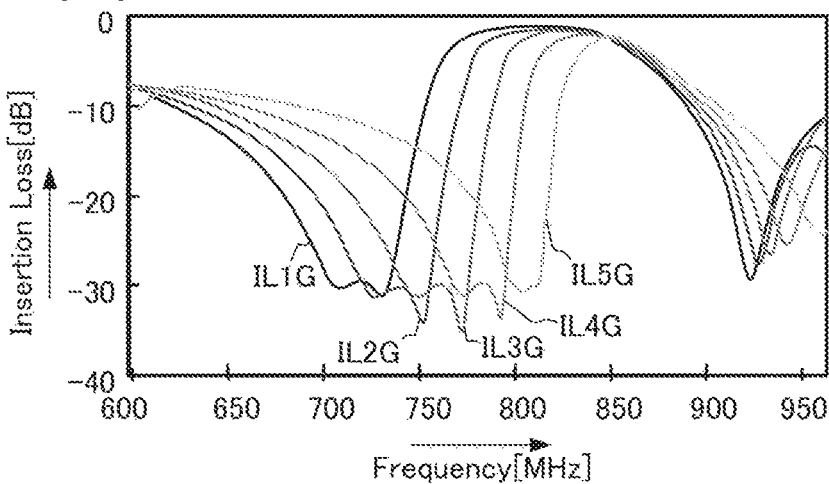

FIG. 6C is a bandpass characteristic graph illustrating bandpass characteristics IL1G, IL2G, IL3G, IL4G, and IL5G of the variable filter circuit 10C. The bandpass characteristics IL1G, IL2G, IL3G, IL4G, and IL5G are set so that the capacitances of the variable capacitances Cs_p1 and Cs_p2 become progressively smaller in the indicated order within a range of 1.0 pF to 10.0 pF. In the bandpass characteristics IL1G, IL2G, IL3G, IL4G, and IL5G, a cutoff frequency on the low-frequency side of the pass band appears on the high-frequency side as the capacitances of the variable capacitances Cs_p1 and Cs_p2 drop. Accordingly, the variable filter circuit 10C can also adjust the cutoff frequency on the low-frequency side of the pass band through control of the variable capacitances Cs_p1 and Cs_p2.

The variable filter circuit according to the first embodiment may be configured as described in these variations. In any of these configurations, the attenuation characteristics near the low-frequency side of the pass band can be made steeper by providing the capacitor Cs1.

Figure 7:
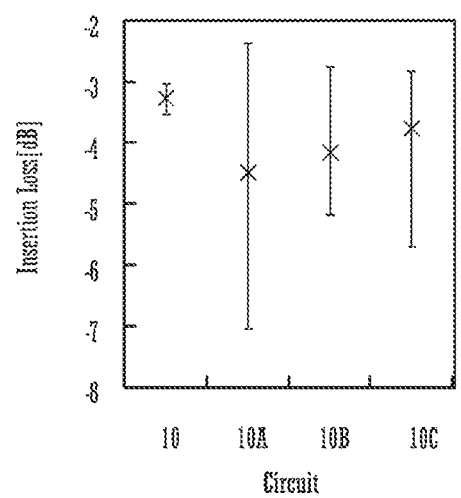
FIG. 7 is a diagram comparing insertion losses of variable filter circuit configurations.

Next, insertion loss in each of the above-described circuit configurations will be described. FIG. 7 is a diagram comparing insertion losses in the circuit configurations. Here, a plurality of samples of different variable capacitances have been extracted, for each circuit configuration, and the averages of minimum insertion loss values among the samples have been plotted. A range of fluctuation in the minimum insertion loss value is also indicated for each sample as a bar.

Compared to the other circuit configurations, the variable filter circuit 10 illustrated in FIG. 1 has more stable fluctuation in the minimum insertion loss value even if the variable capacitance is controlled, and the average thereof is lower as well. The variable filter circuit 10C illustrated in FIG. 5C has a lower average minimum insertion loss value than the variable filter circuit 10A illustrated in FIG. 5A and the variable filter circuit 10B illustrated in FIG. 5B. On the other hand, the variable filter circuit 10B has more stable fluctuation in the minimum insertion loss value than the variable filter circuit 10A and the variable filter circuit 10C. Such properties of each circuit configuration are the same even if the element values, characteristics, and so on of the circuit elements are changed as well.

<<Second Variation>>

FIGS. 8A-8E include circuit diagrams illustrating other variations on the first embodiment.

Figure 8C:
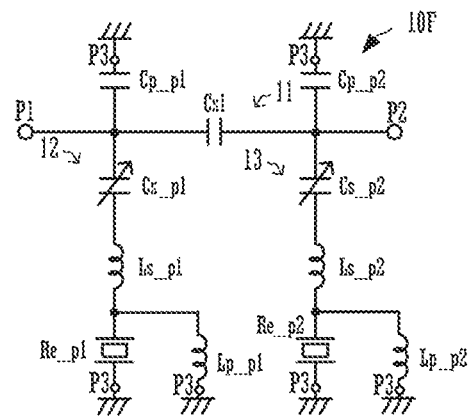
FIGS. 8A-8E include circuit diagrams illustrating other variations on the variable filter circuit according to the first embodiment.
Figure 8A:
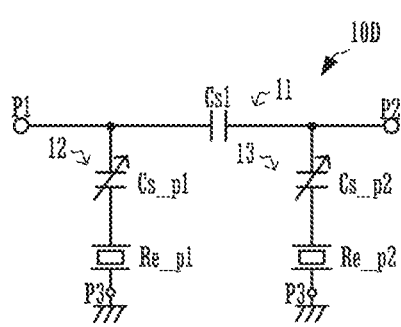

A variable filter circuit 10D illustrated in FIG. 8A has almost the same configuration as in the above-described first embodiment, but the serial inductors Ls_p1 and Ls_p2 and the parallel inductors Lp_p1 and Lp_p2 have been omitted.

Figure 8D:
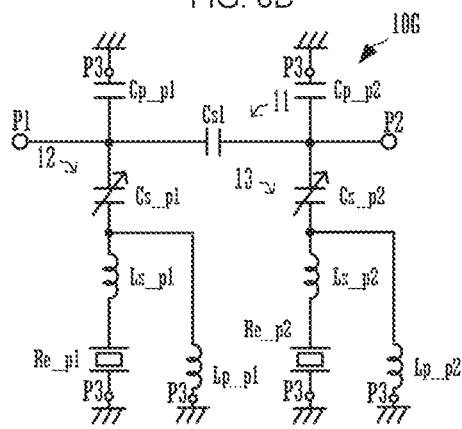
Figure 8B:
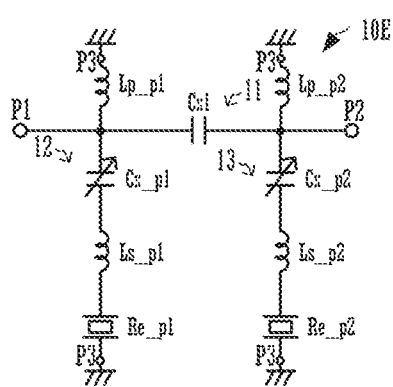

A variable filter circuit 10E illustrated in FIG. 8B has almost the same configuration as in the above-described first embodiment, but the parallel inductors Lp_p1 and Lp_p2 are connected in parallel to serial circuits that include the variable capacitances Cs_p1 and Cs_p2, the serial inductors Ls_p1 and Ls_p2, and the resonators Re_p1 and Re_p2. In other words, one end of the parallel inductor Lp_p1 is connected to a connection point between the parallel arm 12 and the serial arm 11, and another end is connected to the port P3. Likewise, one end of the parallel inductor Lp_p2 is connected to a connection point between the parallel arm 13 and the serial arm 11, and another end is connected to the port P3.

A variable filter circuit 10F illustrated in FIG. 8C has almost the same configuration as in the above-described first embodiment, but the parallel arms 12 and 13 further include parallel capacitors Cp_p1 and Cp_p2. One end of the parallel capacitor Cp_p1 is connected to a connection point between the parallel arm 12 and the serial arm 11, and another end is connected to the port P3. Likewise, one end of the parallel capacitor Cp_p2 is connected to a connection point between the parallel arm 13 and the serial arm 11, and another end is connected to the port P3.

A variable filter circuit 10G illustrated in FIG. 8D has almost the same configuration as the above-described variable filter circuit 10C illustrated in FIG. 5C, but the parallel arms 12 and 13 further include the parallel capacitors Cp_p1 and Cp_p2. One end of the parallel capacitor Cp_p1 is connected to a connection point between the parallel arm 12 and the serial arm 11, and another end is connected to the port P3. Likewise, one end of the parallel capacitor Cp_p2 is connected to a connection point between the parallel arm 13 and the serial arm 11, and another end is connected to the port P3.

Figure 8E:
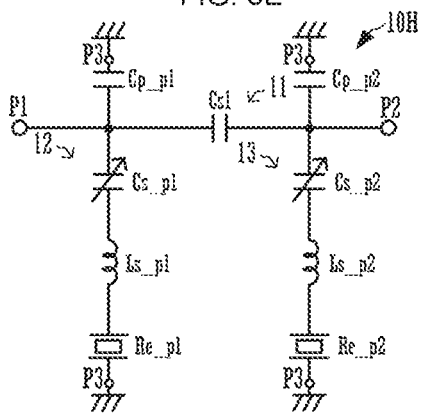

A variable filter circuit 10H illustrated in FIG. 8E has almost the same configuration as in the above-described first embodiment, but the parallel inductors Lp_p1 and Lp_p2 are omitted and the parallel arms 12 and 13 further include the parallel capacitors Cp_p1 and Cp_p2. One end of the parallel capacitor Cp_p1 is connected to a connection point between the parallel arm 12 and the serial arm 11, and another end is connected to the port P3. Likewise, one end of the parallel capacitor Cp_p2 is connected to a connection point between the parallel arm 13 and the serial arm 11, and another end is connected to the port P3.

The variable filter circuit according to the first embodiment may be configured as described in these variations. In any of these configurations, the attenuation characteristics near the low-frequency side of the pass band can be made steeper by providing the capacitor Cs1, as compared to when the capacitor Cs1 is not provided.

Second Embodiment

Figure 9A:
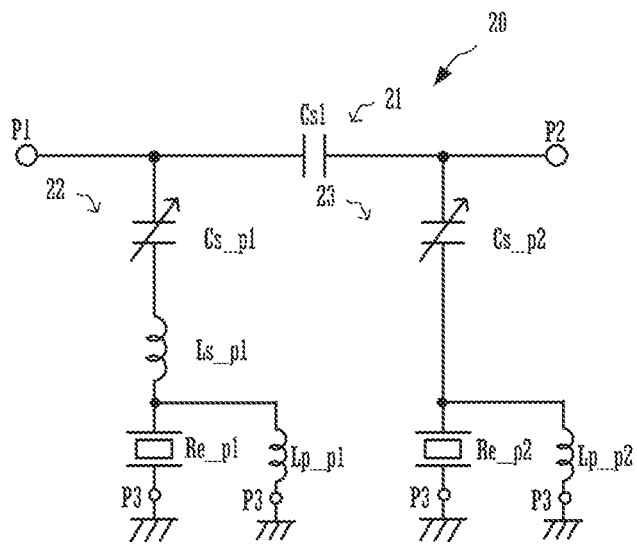
FIGS. 9A-9C include diagrams illustrating a variable filter circuit according to a second embodiment.

FIG. 9A is a circuit diagram illustrating a variable filter circuit 20 according to a second embodiment.

The variable filter circuit 20 includes a serial arm 21 and parallel arms 22 and 23. The parallel arm 22 includes the variable capacitance Cs_p1 and the resonator Re_p1. The parallel arm 23 includes the variable capacitance Cs_p2 and the resonator Re_p2. The resonator Re_p1 has a resonance point and an anti-resonance point further on the high-frequency side than the resonator Re_p2, and the resonator Re_p2 has a resonance point and an anti-resonance point further on the low-frequency side than the resonator Re_p1. In other words, of the parallel arms 22 and 23, the parallel arm 22 corresponds to a communication band further on the high-frequency side, and the parallel arm 23 corresponds to a communication band further on the low-frequency side. The element values of the variable capacitances Cs_p1 and Cs_p2 are controlled in order to appropriately adjust a cutoff frequency on the low-frequency side of the pass band for each of the communication bands to which the parallel arms 22 and 23 in which the respective capacitances are provided correspond.

The parallel arm 22 further includes the serial inductor Ls_p1 and the parallel inductor Lp_p1 in order to widen the range of variation of the cutoff frequency that can be adjusted by controlling the variable capacitance Cs_p1. The parallel arm 23 further includes the parallel inductor Lp_p2 in order to widen the range of variation of the cutoff frequency that can be adjusted by controlling the variable capacitance Cs_p2. In this manner, in the variable filter circuit 20 according to the present embodiment, an asymmetrical circuit configuration, in which the serial inductor Ls_p1 is provided in the one parallel arm 22 but a serial inductor is omitted from the another parallel arm 23, is employed. Omitting a serial inductor from the parallel arm 23 in this manner makes it possible to reduce the circuit size of the variable filter circuit 20.

Employing an asymmetrical circuit configuration that omits some of the inductors as described above makes it possible to reduce the circuit size of the variable filter circuit 20.

Figure 9B:
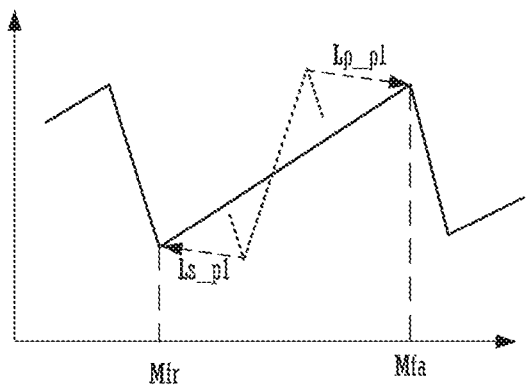
Figure 9C:
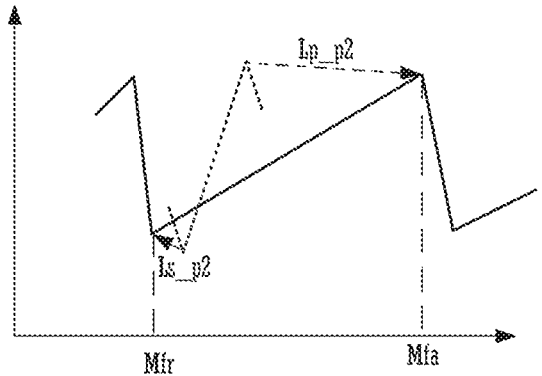

FIGS. 9B and 9C are conceptual diagrams schematically illustrating effects of the respective inductors on the impedance characteristics of a resonator. Impedance waveforms indicated by the dotted lines in the drawings are waveforms corresponding to the resonators alone in the parallel arms 22 and 23, respectively, whereas impedance waveforms indicated by the solid lines are waveforms corresponding to the resonator with the inductors Ls_p1, Lp_P1 being added, and the resonator with the inductor Lp_p2 being added.

For example, in the parallel arm 22 corresponding to the high-frequency side, a change in the waveform, relative to the impedance waveform of the resonator Re_p1, occurring near the anti-resonance point Mfa due to the influence of the parallel inductor Lp_p1 is substantially the same as a change in the waveform occurring near the resonance point Mfr due to the influence of the serial inductor Ls_p1, as illustrated in FIG. 9B. To rephrase, in the parallel arm 22 corresponding to the high-frequency side, an effect of expanding the range of variation of the cutoff frequency achieved by the serial inductor Ls_p1 acts to substantially the same extent as an effect of expanding the range of variation of the cutoff frequency achieved by the parallel inductor Lp_p1.

On the other hand, in the parallel arm 23 corresponding to the low-frequency side, there is a large change in the waveform, relative to the impedance waveform of the resonator Re_p2, occurring near the anti-resonance point Mfa due to the influence of the parallel inductor Lp_p2, and there is a small change in the waveform occurring near the resonance point Mfr due to the influence of the serial inductor (see Ls_p2 in FIG. 1), as illustrated in FIG. 9C. Accordingly, it is easy to maintain the steepness of the impedance change near the resonance point Mfr on the low-frequency side. To rephrase, in the parallel arm 23 corresponding to the low-frequency side, an effect of expanding the range of variation of the cutoff frequency achieved by the parallel inductor Lp_p2 acts to a greater extent, and an effect of expanding the range of variation of the cutoff frequency achieved by the serial inductor (Ls_p2) only acts to a lesser extent.

Accordingly, the serial inductor (Ls_p2) in the parallel arm 23 corresponding to a lower frequency side is most desirable as the inductor to be omitted in order to reduce the circuit size of the variable filter circuit 20. Omitting only the serial inductor (Ls_p2) of the parallel arm 23 makes it possible to suppress the circuit size of the variable filter circuit 20 without necessarily causing significant degradation in the filter characteristics of the variable filter circuit 20.

Note, however, that omitting the serial inductor (Ls_p2) of the parallel arm 23 tends to narrow the range of variation of the cutoff frequency that can be adjusted by controlling the variable capacitance Cs_p2 in the parallel arm 23. Accordingly, an inductor having a lower inductance than the parallel inductor Lp_p1 provided in the other parallel arm 22 can be set as the parallel inductor Lp_p2 provided in the parallel arm 23. Setting the parallel inductor Lp_p2 in this manner makes it possible to prevent significant narrowing of the range of variation of the cutoff frequency that can be adjusted by controlling the variable capacitance Cs_p2 in the parallel arm 23.

Figure 10:
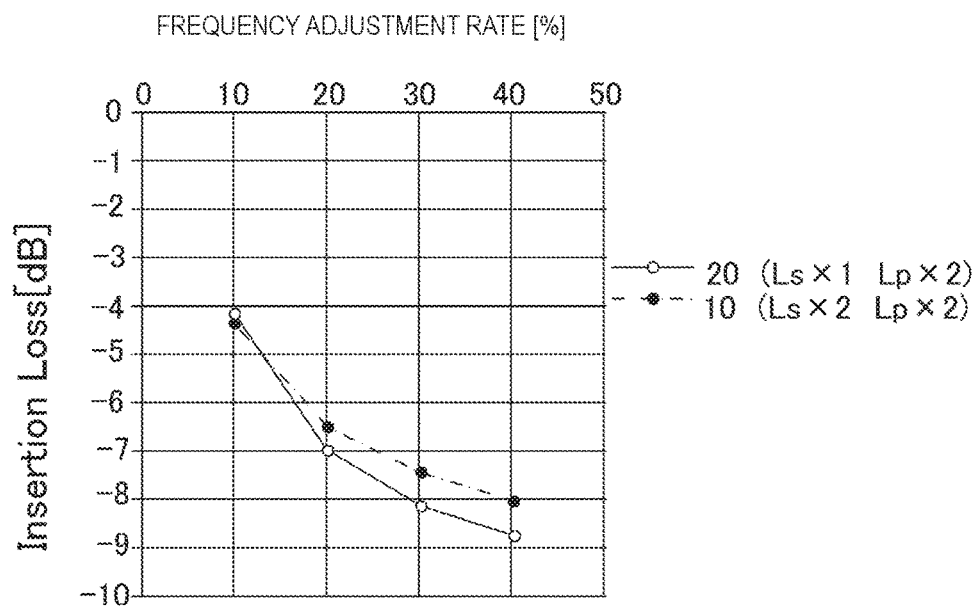
FIG. 10 is a diagram illustrating a result of a characteristic test of the variable filter circuit according to the second embodiment.

Results of experiments carried out for filter characteristics, using a plurality of pieces of sample data prepared for each of different circuit configurations, will be described next. FIG. 10 is a diagram comparing attenuations at points of minimum insertion loss in a pass band in various variable filter circuit configurations set to correspond to the same communication band. FIG. 10 indicates average values of the plurality of pieces of sample data prepared for each of different circuit configurations. Additionally, a plurality of samples in which an adjustment amount of the variable capacitance (a frequency adjustment rate, corresponding to a percentage by which the center frequency of the pass band changes in response to controlling the variable capacitance) differs by constant amounts were prepared for each circuit configuration. Accordingly, in an actual variable filter circuit manufacture, desired filter characteristics are obtained by making fine adjustments to each variable capacitance. A comparison of IL characteristics between the variable filter circuit 10 according to the first embodiment (see FIG. 1) and the variable filter circuit 20 according to the second embodiment (see FIG. 9A) is indicated.

From these experiment results, it can be seen that up to a frequency adjustment rate of approximately 10% in the variable filter circuit, even if the configuration of the variable filter circuit 20, which omits the serial inductor (Ls_p2) of the parallel arm 23 corresponding to the low-frequency side, is employed, there is no significant degradation compared to the variable filter circuit 10, in which all of the inductors are provided.

In this manner, it can be confirmed, even from experiments using sample data, that omitting only the serial inductor (Ls_p2) of the parallel arm 23 as in the variable filter circuit 20 according to the present embodiment makes it possible to suppress the circuit size of the variable filter circuit 20 without necessarily causing significant degradation in the filter characteristics of the variable filter circuit 20.

Third Embodiment

Figure 11:
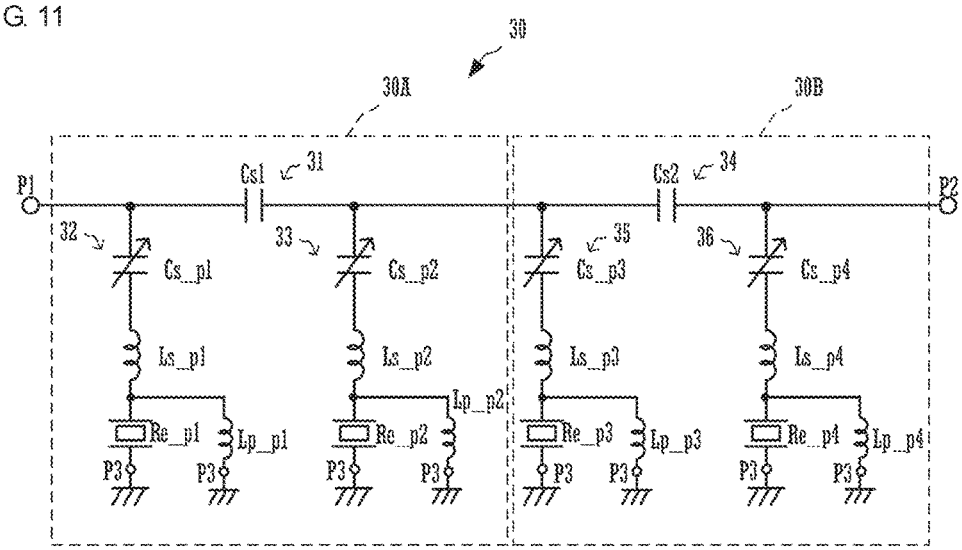
FIG. 11 is a circuit diagram of a variable filter circuit according to a third embodiment.

FIG. 11 is a circuit diagram illustrating a variable filter circuit 30 according to a third embodiment.

The variable filter circuit 30 includes a first circuit portion 30A and a second circuit portion 30B. The first circuit portion 30A and the second circuit portion 30B both have the same circuit configuration as the variable filter circuit 10 described earlier in the first embodiment. The first circuit portion 30A includes a serial arm 31 and parallel arms 32 and 33. The second circuit portion 30B includes a serial arm 34 and parallel arms 35 and 36.

Here, the parallel arm 32 includes the resonator Re_p1, the variable capacitance Cs_p1, the serial inductor Ls_p1, and the parallel inductor Lp_p1. The parallel arm 33 includes the resonator Re_p2, the variable capacitance Cs_p2, the serial inductor Ls_p2, and the parallel inductor Lp_p2. The parallel arm 35 includes a resonator Re_p3, the variable capacitance Cs_p3, a serial inductor Ls_p3, and a parallel inductor Lp_p3. The parallel arm 36 includes a resonator Re_p4, a variable capacitance Cs_p4, a serial inductor Ls_p4, and a parallel inductor Lp_p4.

The resonators Re_p1 and Re_p2 and the resonators Re_p3 and Re_p4 respectively correspond to communication bands having different pass bands and stop bands. Additionally, the variable capacitances Cs_p1 and Cs_p2 and the variable capacitances Cs_p3 and Cs_p4 are controlled to appropriate element values in order to appropriately set filter characteristics in the communication bands to which the resonators Re_p1 and Re_p2 or the resonators Re_p3 and Re_p4 that are connected correspond. The serial inductors Ls_p1 and Ls_p2 and the serial inductors Ls_p3 and Ls_p4, and the parallel inductors Lp_p1 and Lp_p2 and the parallel inductors Lp_p3 and Lp_p4, are each set to appropriate element values in order to appropriately set filter characteristics in the communication bands to which the resonators Re_p1 and Re_p2 or the resonators Re_p3 and Re_p4 that are connected correspond.

In this manner, the variable filter circuit can be implemented as a multi-stage circuit by connecting a plurality of circuit portions 30A and 30B corresponding to the filter circuit 10. Having the circuit portions 30A and 30B handle different frequency bands makes it possible to improve the filter characteristics of the circuit portions 30A and 30B, respectively. As a result, the variable filter circuit can be caused to handle more communication bands.

Although the first circuit portion 30A and the second circuit portion 30B are described here as having the same circuit configuration as the variable filter circuit 10 described in the first embodiment, the circuit configurations according to other variations, the circuit configuration according to the second embodiment, and so on may be combined as appropriate. Additionally, a greater number of circuit portions may be connected and used as well.

Fourth Embodiment

Figure 12:
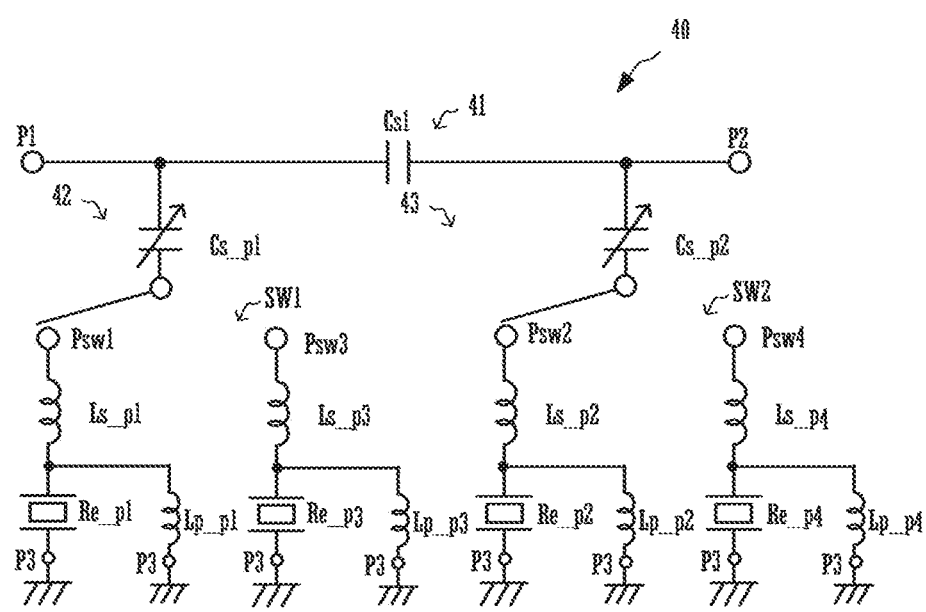
FIG. 12 is a circuit diagram of a variable filter circuit according to a fourth embodiment.

FIG. 12 is a circuit diagram illustrating a variable filter circuit 40 according to a fourth embodiment.

The variable filter circuit 40 includes a serial arm 41 and parallel arms 42 and 43. The parallel arm 42 includes the variable capacitance Cs_p1, a selecting portion SW1, the resonators Re_p1 and Re_p3, the serial inductors Ls_p1 and Ls_p3, and the parallel inductors Lp_p1 and Lp_p3. The parallel arm 43 includes the variable capacitance Cs_p2, a selecting portion SW2, the resonators Re_p2 and Re_p4, the serial inductors Ls_p2 and Ls_p4, and the parallel inductors Lp_p2 and Lp_p4.

The selecting portion SW1 is connected to the port P3 (ground connection end) side of the variable capacitance Cs_p1. The selecting portion SW1 includes a connection switching port Psw1 and a connection switching port Psw3, and can switch the connection switching port Psw1 and the connection switching port Psw3 to connect to the variable capacitance Cs_p1. The resonator Re_p1, the serial inductor Ls_p1, and the parallel inductor Lp_p1 are connected to the connection switching port Psw1. The resonator Re_p3, the serial inductor Ls_p3, and the parallel inductor Lp_p3 are connected to the connection switching port Psw3.

The selecting portion SW2 is connected to the port P3 (ground connection end) side of the variable capacitance Cs_p2. The selecting portion SW2 includes a connection switching port Psw2 and a connection switching port Psw4, and can switch the connection switching port Psw2 and the connection switching port Psw4 to connect to the variable capacitance Cs_p2. The resonator Re_p2, the serial inductor Ls_p2, and the parallel inductor Lp_p2 are connected to the connection switching port Psw2. The resonator Re_p4, the serial inductor Ls_p4, and the parallel inductor Lp_p4 are connected to the connection switching port Psw4.

Like the third embodiment, in the present embodiment, the resonators Re_p1, Re_p2, Re_p3, and Re_p4 respectively correspond to communication bands having different pass bands and stop bands. Additionally, the variable capacitances Cs_p1 and Cs_p2 are controlled to appropriate element values in order to appropriately set filter characteristics in the communication bands to which the resonators Re_p1, Re_p2, Re_p3, and Re_p4 that are connected correspond. The serial inductors Ls_p1, Ls_p2, Ls_p3, and Ls_p4, and the parallel inductors Lp_p1, Lp_p2, Lp_p3, and Lp_p4, are each set to appropriate element values in order to appropriately set filter characteristics in the communication bands to which the resonators Re_p1, Re_p2, Re_p3, and Re_p4 that are connected correspond.

Figures 13A, 13B:
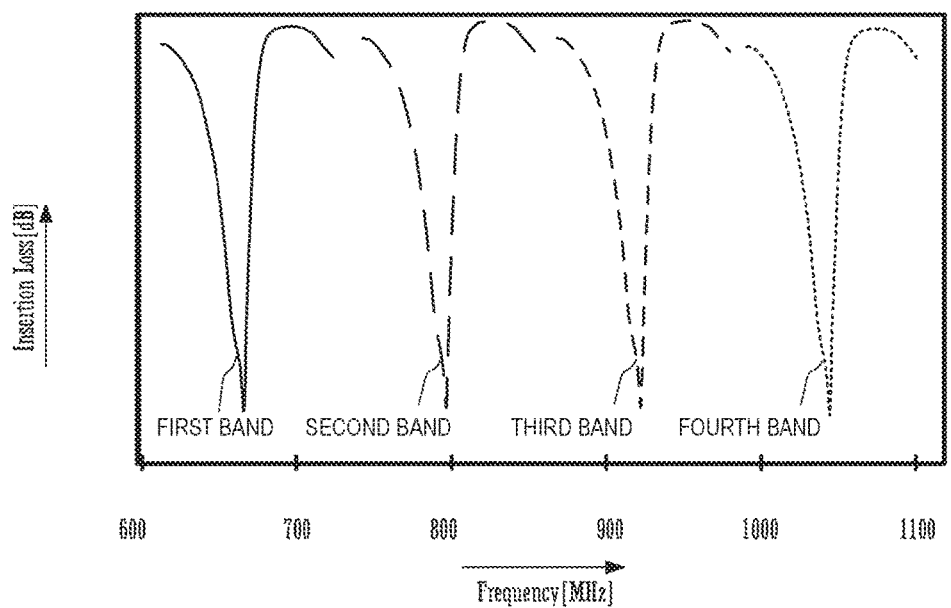
FIGS. 13A and 13B include a chart and a characteristic graph schematically illustrating a function of the variable filter circuit according to the fourth embodiment.

Additionally, with the variable filter circuit 40, the filter characteristics are changed and the corresponding communication band is changed by controlling the selecting portion SW1 to connect one of the connection switching ports Psw1 and Psw3 to the variable capacitance Cs_p1 and by controlling the selecting portion SW2 to connect one of the connection switching ports Psw2 and Psw4 to the variable capacitance Cs_p2. FIGS. 13A and 13B include a chart and a characteristic graph schematically illustrating a correspondence relationship between control states of the selecting portions SW1 and SW2 and the filter characteristics of the variable filter circuit 40. FIG. 13A is the chart illustrating examples of settings for the control states of the resonator selecting portions SW1 and SW2, and FIG. 13B is the characteristic graph indicating changes in a pass band determined according to the settings for the control states of the resonator selecting portions SW1 and SW2.

For example, when causing the filter characteristics of the variable filter circuit 40 to correspond to a first band or a second band, among a plurality of communication bands, that is on the low-frequency side, the selecting portions SW1 and SW2 are controlled so that the connection switching port Psw1 is selected and connected by the selecting portion SW1 and the connection switching port Psw2 is selected and connected by the selecting portion SW2. Furthermore, by controlling the variable capacitance, the pass band of the variable filter circuit 40 is adjusted to the first band or the second band.

Additionally, when causing the filter characteristics of the variable filter circuit 40 to correspond to a third band or a fourth band, among the plurality of communication bands, that is on the high-frequency side, the selecting portions SW1 and SW2 are controlled so that the connection switching port Psw3 is selected and connected by the selecting portion SW1 and the connection switching port Psw4 is selected and connected by the selecting portion SW2. Furthermore, by controlling the variable capacitance, the pass band of the variable filter circuit 40 is adjusted to the third band or the fourth band.

According to this variable filter circuit 40, the selecting portion SW1 is controlled to connect one of the connection switching ports Psw1 and Psw3 to the variable capacitance Cs_p1 and the selecting portion SW2 is controlled to connect one of the connection switching ports Psw2 and Psw4 to the variable capacitance Cs_p2. With this, a large frequency adjustment can be made by the switching performed by the resonator selecting portions SW1 and SW2, and a fine frequency adjustment can be made by adjusting the variable capacitance. This makes it possible to change the filter characteristics of the variable filter circuit 40 so as to correspond to more communication bands.

Furthermore, according to this variable filter circuit 40, many communication bands can be handled without necessarily increasing the total number of serial arms, increasing the total number of variable capacitances, and so on. For example, in the third embodiment described earlier, it is necessary to provide substantially the same number of parallel arms as there are communication bands to be handled, and thus the total number of elements tends to rise due to the elements being provided in each of the parallel arms. However, in the present embodiment, the selecting portions SW1 and SW2 are provided and the variable capacitances Cs_p1 and Cs_p2 are shared among the plurality of communication bands, and thus it is no longer necessary to provide the elements of the parallel arms for each of the communication bands. The total number of the variable capacitances Cs_p1 and Cs_p2 can therefore be suppressed, which makes it possible to prevent the circuit size from increasing, the control of the variable capacitances Cs_p1 and Cs_p2 from becoming complicated, and so on.

Although this embodiment describes an example in which the serial inductors, parallel inductors, and the like provided in the respective parallel arms are connected to the connection switching port sides of the selecting portions, the serial inductors, parallel inductors, and the like may be connected to the variable capacitance sides of the selecting portions. In this case, the total number of serial inductors, parallel inductors, and so on provided in each parallel arm can be suppressed, which makes it possible to further suppress the circuit size. Additionally, although an example in which there are a total of two connection switching ports, resonators, and so on provided in each selecting portion is described here, a total of more than two connection switching ports, resonators, and so on may be provided in each selecting portion. In this case, the variable filter circuit can handle a greater number of communication bands.

Fifth Embodiment

Figure 14:
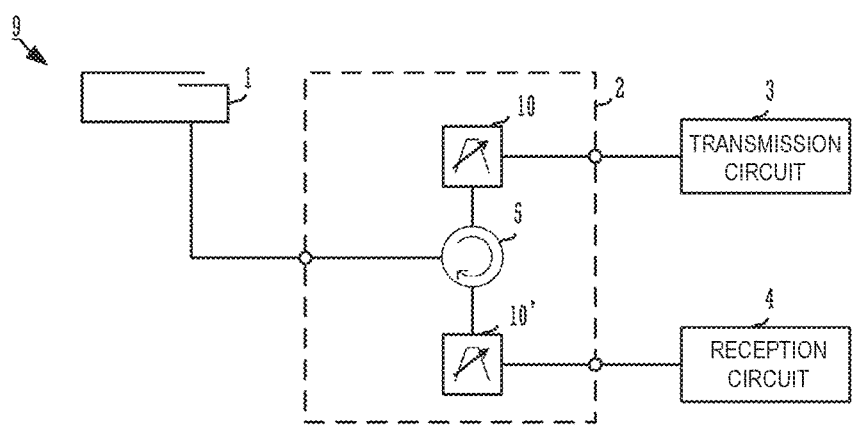
FIG. 14 is a circuit diagram illustrating a wireless communication apparatus according to a fifth embodiment.

FIG. 14 is a block diagram illustrating a wireless communication apparatus 9 according to a fifth embodiment.

The wireless communication apparatus 9 includes an antenna 1, a front end circuit 2, a transmission circuit 3, and a reception circuit 4. The transmission circuit 3 is configured to be capable of handling a plurality of communication bands in a communication system such as LTE, and outputs a transmission signal upon having switched to a corresponding communication band. The reception circuit 4 is configured to be capable of handling a plurality of communication bands in a communication system such as LTE, and accepts the input of a reception signal upon having switched to a corresponding communication band. The front end circuit 2 is connected between the antenna 1, and the transmission circuit 3 and reception circuit 4, and includes the variable filter circuit 10 connected to the transmission circuit 3, a variable filter circuit 10' connected to the reception circuit 4, and a circulator 5. The variable filter circuit 10 and the variable filter circuit 10' have the same configuration as the configuration illustrated in FIG. 1. The circulator 5 gives directionality to a propagation direction of each signal, so that the transmission signal propagates from the transmission circuit 3 to the antenna 1 and the reception signal propagates from the antenna 1 to the reception circuit 4.

In the wireless communication apparatus 9 configured in this manner, the variable filter circuit 10 on the transmission side makes its bandpass characteristics correspond to the communication band handled by the transmission circuit 3, by controlling the variable capacitance. Likewise, the variable filter circuit 10' on the reception side makes its bandpass characteristics correspond to the communication band handled by the reception circuit 4, by controlling the variable capacitance. The variable filter circuit 10 on the transmission side allows signals of a transmission frequency to pass and cuts signals of a reception frequency. On the other hand, the variable filter circuit 10' on the reception side allows signals of the reception frequency to pass and cuts signals of the transmission frequency. In other words, signals of frequencies on opposite sides are mutually attenuated. Doing so suppresses transmission signals from affecting the reception circuit, making it possible to ensure good reception sensitivity. Accordingly, in the case where the transmission frequency is higher than the reception frequency, the variable filter circuit 10 on the transmission side can have the same configuration as that illustrated in FIG. 1. Conversely, in the case where the reception frequency is higher than the transmission frequency, the variable filter circuit 10' on the reception side can have the same configuration as that illustrated in FIG. 1.

When the variable filter circuits 10 and 10' are given the same configuration as that illustrated in FIG. 1, it is necessary for the variable filter circuits 10 and 10' to meet the following first requirement, second requirement, and so on. The first requirement is that in at least one parallel arm, the anti-resonance point (Mfa) in the case where there is no variable capacitance is at a frequency that is higher than an upper limit frequency on the high-frequency side of the stop band of the communication band, among the plurality of communication bands, that is furthest on the high-frequency side. Meanwhile, the second requirement is that in at least one parallel arm, the resonance point (Mfr) in the case where there is no variable capacitance is at a frequency that is lower than a lower limit frequency on the low-frequency side of the stop band of the communication band, among the plurality of communication bands, that is furthest on the low-frequency side. If the variable filter circuits 10 and 10' meet the first requirement and the second requirement, the plurality of communication bands are all contained within a band between the resonance point (Mfr) and the anti-resonance point (Mfa), and thus the cutoff frequencies on the low-frequency sides of the pass bands of the variable filter circuits 10 and 10' can be adjusted to the low-frequency sides of the pass bands of the respective plurality of communication bands by controlling the variable capacitances of the variable filter circuits 10 and 10'.

Note that instead of the first pass band on the low-frequency side, the variable filter circuits 10 and 10' may match the second pass band further on the high-frequency side to the communication bands handled by the transmission circuit 3, the reception circuit 4, and so on. In this case, the necessary requirement for the variable filter circuits 10 and 10' is that in at least one parallel arm, the sub-resonance point (Sfr) in the case where there is no variable capacitance is at a frequency that is lower than a lower limit frequency on the low-frequency side of the stop band of the communication band, among the plurality of communication bands, that is furthest on the low-frequency side. If the variable filter circuits 10 and 10' meet this requirement, the plurality of communication bands are all contained within a band higher than the sub-resonance point (Sfr), and thus the cutoff frequencies on the low-frequency sides of the second pass band on the high-frequency sides of the variable filter circuits 10 and 10' can be adjusted to the low-frequency sides of the pass bands of the respective plurality of communication bands by controlling the variable capacitances of the variable filter circuits 10 and 10'.

The pass bands of the variable filter circuits 10 and 10' can also be adjusted in a frequency band higher than the anti-resonance point (Mfa) by controlling the variable capacitances of the variable filter circuits 10 and 10' in this manner.

The present disclosure can be carried out as described thus far. Note that the present disclosure can be carried out through any other configuration aside from those described in the foregoing embodiments as long as that configuration corresponds to the configurations described in the claims. For example, a circuit, element, or the like in which a variable inductance rather than a variable capacitance is used as the variable reactance can also be used.

REFERENCE SIGNS LIST

9 WIRELESS COMMUNICATION APPARATUS
1 ANTENNA
2 FRONT END CIRCUIT
3 TRANSMISSION CIRCUIT
4 RECEPTION CIRCUIT
5 CIRCULATOR
10, 30, 40 VARIABLE FILTER CIRCUIT
11, 31, 34, 41 SERIAL ARM
12, 13, 32, 33, 35, 36, 42, 43 PARALLEL ARM

The invention claimed is:

1. A variable filter circuit comprising:
a serial arm connected between a first input/output end and a second input/output end, a first parallel arm including a first resonator connected in series between the first input/output end and a ground connection end, and a second parallel arm including a second resonator connected in series between the second input/output end and the ground connection end,
wherein the serial arm includes a capacitor connected in series between the first input/output end and the second input/output end,
at least one of the first and second parallel arms includes a variable reactance connected in series to the resonator in the respective parallel arm, and
at least one of the first parallel arm and the second parallel arm further includes a parallel inductor and/or a parallel capacitor connected in parallel to the first or second resonator.

2. The variable filter circuit according to claim 1, wherein at least one of the first parallel arm and the second parallel arm further includes a serial inductor connected in series to the first or second resonator.

3. A wireless communication apparatus comprising:
a front end circuit including the variable filter circuit according to claim 1;
an antenna; and
a communication circuit connected to the antenna through the front end circuit.

4. The wireless communication apparatus according to claim 3,
wherein the communication circuit handles a plurality of communication bands;
when at least one of the parallel arms does not include the variable reactance, an anti-resonance point is higher than an upper limit frequency on a high-frequency side of a stop band of the communication band, among the plurality of communication bands, that is furthest on the high-frequency side; and
when at least one of the parallel arms does not include the variable reactance, a resonance point is lower than a lower limit frequency on a low-frequency side of a stop band of the communication band, among the plurality of communication bands, that is furthest on the low-frequency side.

5. The wireless communication apparatus according to claim 3,
wherein the variable filter circuit includes a serial inductor connected in series to each of the first and second resonators;
the communication circuit handles a plurality of communication bands; and
when at least one of the parallel arms does not include the variable reactance, a sub-resonance point is lower than a lower limit frequency on a low-frequency side of a stop band of the communication band, among the plurality of communication bands, that is furthest on the low-frequency side.

6. The variable filter circuit according to claim 1, wherein each of the first and second parallel arms includes a variable reactance connected in series to the first and second resonators, respectively.

7. The variable filter circuit according to claim 1, wherein the variable reactance is a variable capacitance.

8. The variable filter circuit according to claim 1, wherein the variable reactance is a variable inductance.

9. A variable filter circuit comprising:
a serial arm connected between a first input/output end and a second input/output end, a first parallel arm including a first resonator connected in series between the first input/output end and a ground connection end, and a second parallel arm including a second resonator connected in series between the second input/output end and the ground connection end,
wherein the serial arm includes a capacitor connected in series between the first input/output end and the second input/output end,
at least one of the first and second parallel arms includes a variable reactance connected in series to the resonator in the respective parallel arm, and
at least one of the first parallel arm and the second parallel arm includes a parallel inductor connected in parallel to the first or second resonator and a serial inductor connected in series to a circuit in which the first or second resonator and the parallel inductor are connected in parallel.

10. A variable filter circuit comprising:
a serial arm connected between a first input/output end and a second input/output end, a first parallel arm including a first resonator connected in series between the first input/output end and a ground connection end, and a second parallel arm including a second resonator connected in series between the second input/output end and the ground connection end,
wherein the serial arm includes a capacitor connected in series between the first input/output end and the second input/output end,
at least one of the first and second parallel arms includes a variable reactance connected in series to the resonator in the respective parallel arm, and
at least one of the first parallel arm and the second parallel arm includes a serial inductor connected in series to the first or second resonator and a parallel inductor connected in parallel to a circuit in which the first or second resonator and the serial inductor are connected in series.

11. A variable filter circuit comprising:
a serial arm connected between a first input/output end and a second input/output end, a first parallel arm including a first resonator connected in series between the first input/output end and a ground connection end, and a second parallel arm including a second resonator connected in series between the second input/output end and the ground connection end,
wherein the serial arm includes a capacitor connected in series between the first input/output end and the second input/output end,
at least one of the first and second parallel arms includes a variable reactance connected in series to the resonator in the respective parallel arm,
the first parallel arm includes a first parallel inductor connected in parallel to the first resonator and the second parallel arm further includes a second parallel inductor connected in parallel to the second resonator,
the first parallel arm includes a serial inductor connected in series to the first resonator, and
the second parallel arm does not include a serial inductor connected in series to the second resonator.

12. The variable filter circuit according to claim 11, wherein a resonance point and an anti-resonance point of the first resonator included in the first parallel arm are further on a high-frequency side than a resonance point and an anti-resonance point of the second resonator included in the second parallel arm.

13. The variable filter circuit according to claim 11, wherein an inductance of the second parallel inductor included in the second parallel arm is lower than an inductance of the first parallel inductor included in the first parallel arm.

14. A variable filter circuit comprising:
a serial arm connected between a first input/output end and a second input/output end, a first parallel arm including a first resonator connected in series between the first input/output end and a ground connection end, and a second parallel arm including a second resonator connected in series between the second input/output end and the ground connection end,
wherein the serial arm includes a capacitor connected in series between the first input/output end and the second input/output end,
at least one of the first and second parallel arms includes a variable reactance connected in series to the resonator, and
at least one of the first parallel arm and the second parallel arm includes a plurality of resonators and a switch that selects one of the plurality of resonators and connects the selected resonator in series to the variable reactance.

15. The variable filter circuit according to claim 14,
wherein at least one of the first parallel arm and the second parallel arm includes a plurality of the serial inductors respectively connected in series to the plurality of resonators; and
the switch selects one of the plurality of serial inductors and one of the plurality of resonators as a set and connects the selected inductor and the selected resonator in series to the variable reactance.

16. The variable filter circuit according to claim 14,
wherein at least one of the first parallel arm and the second parallel arm includes a plurality of parallel inductors respectively connected in parallel to the plurality of resonators; and the switch selects one of the plurality of parallel inductors and one of the plurality of resonators as a set and connects the selected inductor and the selected resonator in series to the variable reactance.

* * * * *

UNITED STATES PATENT AND TRADEMARK OFFICE
CERTIFICATE OF CORRECTION

PATENT NO. : 9,787,277 B2
APPLICATION NO. : 15/230764
DATED : October 10, 2017
INVENTOR(S) : Takashi Ogami et al.

It is certified that error appears in the above-identified patent and that said Letters Patent is hereby corrected as shown below:

On the Title Page

Item [63], insert:
-- Related U.S. Application Data
Continuation of application No. PCT/JP2015/053170, filed on Feb. 5, 2015. --

Signed and Sealed this
Seventeenth Day of April, 2018

Andrei Iancu
*Director of the United States Patent and Trademark Office*